(12) United States Patent
Horiuchi et al.

(10) Patent No.: US 6,699,401 B1
(45) Date of Patent: Mar. 2, 2004

(54) METHOD FOR MANUFACTURING SI-SIC MEMBER FOR SEMICONDUCTOR HEAT TREATMENT

(75) Inventors: Yushi Horiuchi, Yamagata (JP); Shigeaki Kuroi, Yamagata (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 0 days.

(21) Appl. No.: 09/958,911

(22) PCT Filed: Feb. 15, 2000

(86) PCT No.: PCT/JP00/00840

§ 371 (c)(1),
(2), (4) Date: Oct. 15, 2001

(87) PCT Pub. No.: WO01/60764

PCT Pub. Date: Aug. 23, 2001

(51) Int. Cl.⁷ .............................. B22P 19/00; B44C 1/22; C03C 15/00; C03C 25/68; C23F 1/00
(52) U.S. Cl. .......................................... 216/108; 164/91
(58) Field of Search .................. 216/108; 164/66.1, 164/67.1, 68.1, 72, 91, 98; 264/5, 30

(56) References Cited

U.S. PATENT DOCUMENTS

| | | | |
|---|---|---|---|
| 4,904,515 A | 2/1990 | Matsuo et al. ................ 428/67 |
| 4,987,016 A * | 1/1991 | Ohto et al. ................ 428/34.1 |
| 5,179,049 A | 1/1993 | Numata et al. ................ 501/88 |
| 5,374,412 A | 12/1994 | Pickering et al. .......... 423/346 |
| 5,464,655 A * | 11/1995 | Takahata ................ 427/238 |
| 5,589,116 A | 12/1996 | Kojima et al. .............. 264/65 |
| 5,941,297 A * | 8/1999 | Young ........................ 164/62 |

FOREIGN PATENT DOCUMENTS

| | | |
|---|---|---|
| DE | 37 01 691 | 4/1990 |
| DE | 691 31 247 | 9/1999 |
| EP | 0 486 938 | 5/1999 |
| JP | 62-122212 | 6/1987 |
| JP | 63-35452 | 2/1988 |
| JP | 1-36981 | 8/1989 |
| JP | 5-32458 | 2/1993 |
| JP | 6-168900 | 6/1994 |
| JP | 6-206718 | 7/1994 |
| JP | 6-211574 | 8/1994 |
| JP | 9-106953 | 4/1997 |
| JP | 10-45476 | 2/1998 |
| JP | 11-8216 | 1/1999 |

OTHER PUBLICATIONS

JIS B 0601–1982, UDC 621.9.015:621.7.015.
"Surface Roughness—Definations and Designation," Japanese Industrial Standard, JIS B 0601–1994, UDC 003.62:621.7.015.

* cited by examiner

*Primary Examiner*—Gregory Mills
*Assistant Examiner*—Roberts Culbert
(74) *Attorney, Agent, or Firm*—Foley & Lardner

(57) ABSTRACT

A method for producing a Si—SiC member for heat treatment of semiconductor, which is suitable for heat treatment of a semiconductor wafer with a large diameter and capable of reducing the contamination of the semiconductor wafer as much as possible is provided. Further, a method for producing a Si—SiC member for heat treatment of semiconductor capable of reducing the contamination of the semiconductor wafer as much as possible and causing no slip is provided.

This method comprises the first step of kneading a SiC powder having a total metal impurity quantity of 0.2 ppm or less with a molding assistant; the second step of forming a compact from the kneaded raw material; the third step of calcining the compact; the fourth step of purifying the calcined body; and the fifth step of impregnating the purified body with silicon within a sealed vessel provided in a heating furnace body.

10 Claims, 8 Drawing Sheets

Film Internal Concentration Distribution of Fe

Film Internal Concentration Distribution of Na

METHOD FOR MANUFACTURING SI-SIC MEMBER FOR SEMICONDUCTOR HEAT TREATMENT

BACKGROUND OF THE INVENTION

1. Field of the Invention

This invention relates to a method for producing a Si—SiC member for heat treatment of semiconductor, for example, silicone monocrystal wafer and, more particularly, to a method for producing a Si—SiC member for heat treatment of semiconductor capable of reducing the contamination of the semiconductor as much as possible.

2. Description of Prior Arts

Conventionally, a Si—SiC material consisting of silicone (Si) and silicon carbide (SiC) has been used for a member for heat treatment of semiconductor, for example, a wafer boat for heat treatment of semiconductor (hereinafter referred to as wafer boat) because of its excellent compactness, purity and strength.

The recent higher integration of semiconductor devices, however, more strictly requests a higher purity for a heat-treating jig such as the wafer boat for heat treatment of semiconductor wafer, and the higher purity is requested also for the Si—SiC material forming the base material of this wafer boat.

Such conventional Si—SiC materials could not comply with the request of the higher purity with a content of Fe of 0.2 ppm or more and a total content of Ni, Cu, Na, Ca, Cr and K of 0.2 ppm or more as the metal impurity content even in case of a one called high-purity base material.

Further, in both the oxidation diffusion step of high temperature and the LP-CVD step of relatively low temperature, the diffusion of impurities from the wafer boat material to the semiconductor wafer is unavoidable.

Thus, giving attention to that a CVD-SiC film has excellent characteristics such as (1) excellent heat resistance and corrosion resistance, (2) an extremely small content of metal impurities, (3) suppressibility of diffusion of impurities such as the base material internal metals to the semiconductor wafer, and (4) excellent grinding characteristic with high compactness free from internal bubbles and high hardness, it has been taken as the measure for preventing the contamination to a semiconductor wafer W1, as shown in FIG. 10, to form a CVD-SiC film 21 on the surface 24 of the base material 23 of a wafer boat 22 to suppress the diffusion of the metal impurities contained in the base material 23.

However, the Si—SiC base material 23 used for the conventional wafer boat 22 contains, as the metal impurity concentration, 0.2 ppm or more of Fe and 0.2 ppm or more of the total content of other metallic impurities as described above. When the base material 22 contains lots of impurities in this way, the impurities are diffusively present also on the surface 21s of the SiC film 21 in the formation of the CVD-SiC film, and the semiconductor wafer W1 is consequently contaminated when placed on this wafer boat and heat-treated. This diffusion of impurities is supposedly caused by that the impurities present in the Si—SiC base material segregate at the tip of the CVD crystal during the growth thereof and move in the growing direction, although a general SiC film is higher in purity than the base material 22 with a bulk concentration of about 0.04 ppm for Fe.

Accordingly, in order to remove the segregated metal impurities, a strict washing with fluoric acid was performed in the past.

In order to solve such troubles, Japanese Patent Application Laid-Open No. 6-206718 discloses a high-temperature semiconductor processing apparatus formed, in stead of forming the CVD-SiC film on the Si—SiC base material, by use of an integrated self-standing CVD-SiC of ultra-high purity having a total metal impurity content of about 5 ppm by weight or less without using this base material.

This high-temperature semiconductor processing apparatus, however, has problems of low mechanical strength and limitation in the form of the apparatus to be manufactured because it has no base material.

Further, in cases where a nucleus for reaction is generated in the film forming process, and a crystal growth then occurs on the basis of this nucleus to generate the CVD-SiC film, projections may be formed on the surface of the CVD-SiC film although the size or number is varied depending on the synthetic condition. In order to provide the self-standing CVD-SiC, in this case, no grinding is generally performed so as to provide a strength as high as possible.

Accordingly, when a semiconductor wafer with a large diameter, for example, 8 inches or more is heated at a high temperature of 1100° C. or higher by use of the wafer boat, the problem of such projections causing a dislocation (so-called slip) in the semiconductor wafer arises.

Therefore, a method for producing a member for heat treatment of semiconductor suitable for the heat treatment of a semiconductor wafer with a large diameter, free from contamination of the semiconductor wafer, and causing no slip has been desired.

SUMMARY OF THE INVENTION

One object of this invention is to provide a method for producing a Si—SiC member for heat treatment of semiconductor, which is suitable particularly for heat treatment of a semiconductor war with a large diameter and free from contamination of the semiconductor wafer. Further, another object of this invention is to provide a method for producing a Si—SiC member for heat treatment of semiconductor, which is free from contamination of a semiconductor wafer and causing no slip.

The method according to this invention comprises the first step of kneading a SiC powder having a total metal impurity quantity of 0.2 ppm or less with a molding assistant; the second step of molding a compact from the kneaded raw material; the third step of calcining the compact; the fourth step of purifying the calcined body; and the fifth step of impregnating the purified body with silicon within a sealed vessel provided in a heating furnace body.

It preferably further comprises the sixth step of machining the part to make contact with a semiconductor to be heat-treated into a surface roughness Ra (JIS B0601-1982) of 0.2 μm or less.

In this invention, the first to fifth steps or the first to sixth steps are more preferably performed in this numerical order.

More preferably, the sealed vessel is formed of a porous carbon material having a porosity of 7–20%. The heating furnace body is provided with a mechanism for introducing and discharging an inert gas. The purifying step is performed by a heat treatment at a temperature of 1900–2000° C. in halogen-containing atmosphere. The machining process is performed by use of a diamond blade. A CVD-SiC film forming step is performed after the machining step. A wet acid washing is performed after the CVD-SiC film forming step. A heat treatment is performed in high-temperature oxidative atmosphere after the wet acid washing step to form a silicon oxide film on the surface, and the silicon oxide film is thereafter removed by wet acid washing.

This invention is further described from another point of view.

As the purity of the SiC powder, the total metal impurity quantity is 0.2 ppm or less. When a quantity exceeding 0.2 ppm is present in the raw material stage, the ultra-high purification particularly to the inner part of the Si—SiC member is difficult even if the purifying treatment after kneading or each treatment step in a contamination-preventing environment is performed.

As the sealed vessel, a vessel having no through-pore at least in the thickness direction of the material constituting it is preferably used. Particularly, a vessel having a lid structure for taking in and out the purified body of the SiC member (in other words, having a fitting part) is preferred.

The reason of using the porous carbon material is as follows. When the purified body of the SiC member and the impregnating silicon are arranged within the sealed vessel, and a heating impregnation is performed at 1460° C. or higher, the impurities left, even if slight, in the purified body are evaporated therefrom. In order to prevent the vapor from being stayed within the sealed vessel, the porous material is preferred. Further, as the material having a uniform pore distribution over the whole vessel to allow the evaporation in any parts and facilitate the higher purification and minimized in generation of particles, the carbon material is preferable.

The porosity is preferably set to 7–20%. With less than 7%, the evaporation cannot be effectively performed, and it is difficult to increase the purity of the Si—SiC member. Since the impurities adhesively left in the vessel are accumulated when the impregnating step is performed a plurality of times by use of the same sealed vessel for the industrial production, the possibility of contaminating the Si—SiC member with such impurities is enhanced. When the porosity exceeds 20%, it is difficult to effectively shield the impurities generated from the constituting material of the heating furnace body. The more preferable porosity is 10–15%.

A mechanism for introducing and discharging an inert gas is preferably provided. By the structure of carrying the inert gas within the heating furnace body, the vapor leaving the sealed vessel can be more efficiently discharged without being left in the heating furnace body.

This invention is further illustrated from another point of view.

This invention relates to an improvement in a Si—SiC member for heat treatment of semiconductor based on Si—SiC comprising SiC impregnated with Si, and the preferable form of the member is as follows.

Namely, in this Si—SiC member for heat treatment of semiconductor, the content of Fe is 0.05 ppm or less, as the metal impurity content of the Si—SiC base material, the total content of Ni, Cu, Na, Ca, Cr and K is 0.1 ppm or less, and the part at least making contact with a semiconductor has a surface roughness (Ra) of 0.20 µm or less.

More preferably, this Si—SiC member for heat treatment of conductor has a CVD-SiC film formed on the surface of the Si—SiC base material, wherein the content of Fe and Na in at least the area of 10 µm from the surface of the CVD-SiC film is 300 ppb or less.

A more preferable method for producing this Si—SiC member for heat treatment of semiconductor is as follows.

Namely, the method comprises the kneading step of kneading a SiC powder containing metal impurities of 0.05 ppm or less of Fe and 0.1 ppm or less of the total of Ni, Na, Ca, Cr, and K with a molding assistant; the molding step of molding the kneaded raw material into a compact; the calcining step of calcining the compact; the purifying step of purifying the calcined body; the impregnating step of impregnating the purified body with Si; and the machining step of machining the part to make contact with a semiconductor wafer to be put thereon of the member impregnated with silicon into a surface roughness (Ra) of 0.20 µm or less.

The machining step is preferably performed by use of a diamond blade.

In the impregnating step, the calcined body of the member is housed in a sealed vessel provided within the heating furnace body to impregnate the calcined body of the member with Si.

Further, a CVD-SiC film forming step is preferably performed after the machining step.

In the CVD-SiC film formed in the CVD-SiC film forming step, the content of Fe and Na in at least the area of 10 µm from the surface of this film is preferably set to 300 ppb or less.

DESCRIPTION OF THE PREFERRED EMBODIMENT

The member for heat treatment of semiconductor according to this invention will now be described in detail with reference to the preferred embodiments thereof.

As the structure of the member for heat treatment of semiconductor according to this invention, two embodiments are considerable.

The first embodiment comprises a member for heat treatment of semiconductor wherein an ultra-high purity Si—SiC consisting of SiC impregnated with Si is used as the base material of the member for heat treatment of a semiconductor such as wafer boat or single-wafer-processing susceptor, and the part to make contact with the semiconductor of the member is extremely flattened.

The second embodiment comprises a member of heat treatment of semiconductor wherein an ultra-high purity Si—SiC consisting of SiC impregnated with Si is used as the base material of the member for heat treatment of semiconductor, the part to make contact with the semiconductor of the member is extremely flattened, and a CVD-SiC film is formed on the base material surface including this flattened part.

A vertical wafer boat as a typical example of the first embodiment of the Si—SiC member for heat treatment of semiconductor according to this invention is illustrated below in reference to the drawings.

Figure 1:
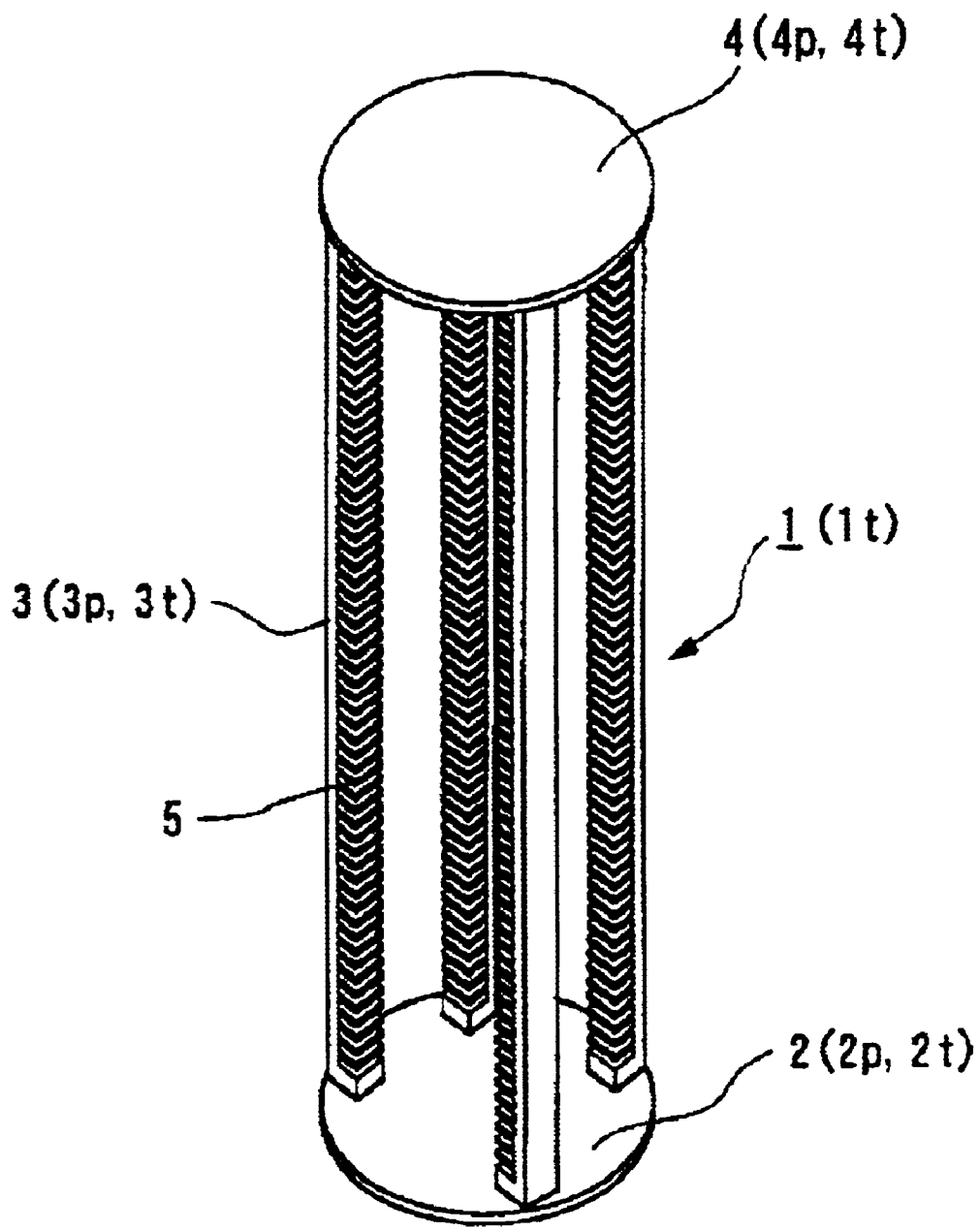
FIG. 1 is a perspective view of a Si—SiC wafer boat for heat treatment of semiconductor according to this invention.

A Si—SiC wafer boat, for example, a vertical wafer boat 1 is constituted, as shown in FIG. 1, by assembling a bottom plate 2, strut 3, and top plate 4 formed of a Si—SiC base material.

Figure 2:
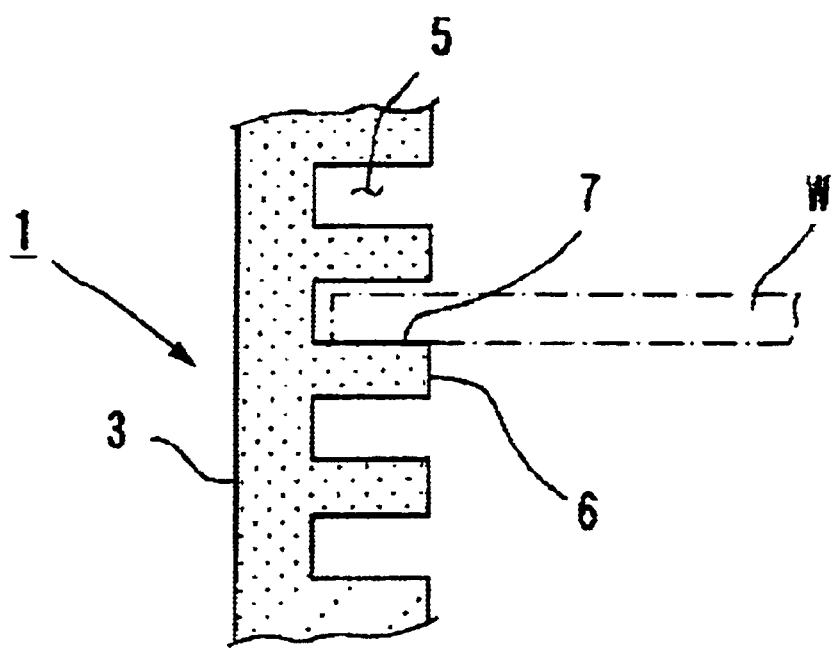
FIG. 2 is a sectional view of an essential part of the Si—SiC wafer boat for heat treatment of semiconductor of FIG. 1.

The strut 3, which has, for example, a square section, is stood by four on the bottom plate 2, and a support part 6 for loading a semiconductor wafer W is formed on each strut 3. The support part 6 has a support groove 5 longitudinally formed in comb-tooth shape as shown in FIG. 2.

The Si—SiC wafer boat base material consisting of the bottom plate, strut and top plate has ultra-high purity with a Fe content of 0.05 ppm or less and a total content of Ni, Cu, Na, Ca, Cr and K of 0.1 ppm or less as the metal impurity content.

The part to make contact with the semiconductor wafer W to be loaded of the wafer boat 1, for example, the upper surface 7 of the support part 6 is extremely flattened into a surface roughness (Ra) of 0.20 μm or less.

The reason of setting the Fe content of the base material to 0.05 ppm or less and the total content of typical contained metals to 0.1 ppm or less is to prevent the semiconductor wafer W from being metal-contaminated even if no CVD-SiC film is formed on the base material in the heat treatment of the semiconductor wafer W by use of the wafer boat 1.

When the Fe content exceeds 0.05 ppm, and the total content of the above other contained metals exceeds 0.1 ppm, the semiconductor wafer W is remarkably metal-contaminated in the heat treatment of the semiconductor wafer W by use of the wafer boat 1.

The reason of setting the surface roughness (Ra) of the part to make contact with the semiconductor wafer W of the wafer boat 1 is to prevent the occurrence of slip on the surface of the semiconductor wafer W in the heat treatment of the semiconductor wafer W by use of the wafer boat 1.

A surface roughness (Ra) exceeding 0.20 μm causes the slip on the surface of the semiconductor wafer W in the heat treatment of the semiconductor wafer W by use of the wafer boat 1.

Figure 3:
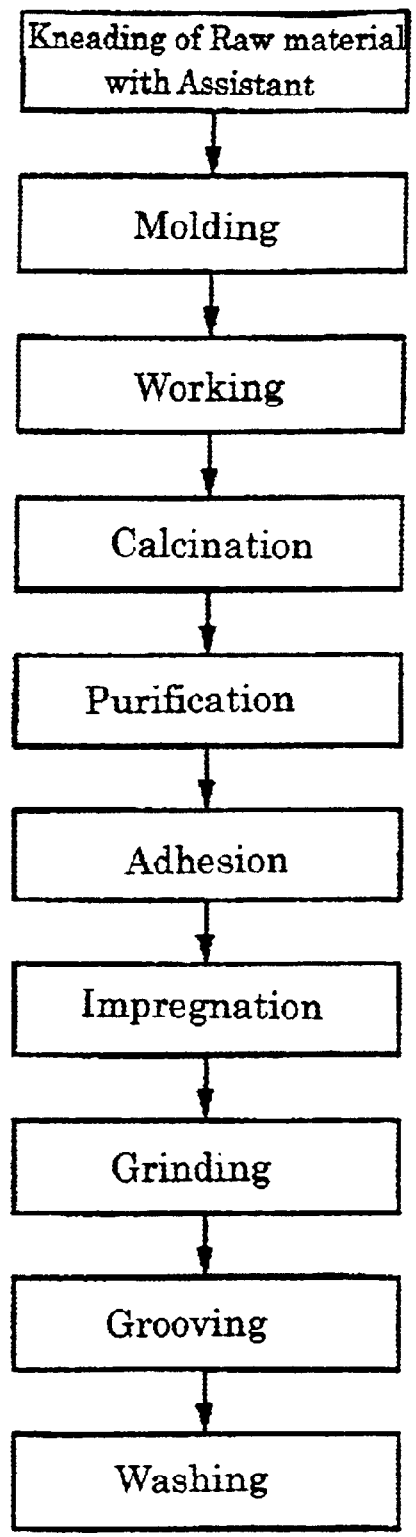
FIG. 3 is a flow charge for production of the Si—SiC wafer boat for heat treatment of semiconductor according to this invention.

The Si—SiC wafer boat 1 having the structure as described above can be produced according to a process flow as shown in FIG. 3.

Namely, the producing process of the wafer board comprises the kneading step of kneading a SiC powder having a total metal impurity quantity of 0.2 ppm or less with a molding assistant; the molding step of molding the kneaded raw material into a bottom plate compact 2p, a strut compact 3p and a top plate compact 4p; the step of working the compacts 2p, 3p, 4p; the step of calcining the worked compacts 2p, 3p, 4p; the purifying step of purifying the calcined compacts 2t, 3t, 4t in halogen gas-containing atmosphere at 1900–2000° C.; the adhering step of adhering the resulting purified bodies 2t, 3t, 4t by use of an adhesive; the impregnating step of impregnating the adhesively formed wafer boat purified body it with silicon followed by heating; the step of grinding the wafer boat 1 impregnated with silicon; the grooving step of forming a plurality of semiconductor wafer-loading support grooves 5 on the strut 3 of the wafer boat 1; and the step of washing the resulting wafer boat 1.

In the kneading step, a mixture of the fine powder aggregate and rough powder aggregate having different average particle sizes of a SiC powder with a total metal impurity quantity of 0.2 ppm or less and ultra-high purity, which, for example, contains 0.05 ppm or less of Fe and 0.1 ppm or less in total of metal impurities of Ni, Cu, Na, Ca, Cr, and K, is used as the starting material, and a sintering assistant or molding assistant such as phenolic resin, acrylic resin or the like is mixed to the SiC powder.

In the calcining step, the compacts 2p, 3p, 4p are heated for about 2 hours under an ordinary condition, for example, in Ar gas atmosphere at 1500–2000° C., to provide the calcined bodies 2t, 3t, 4t.

Figure 4:
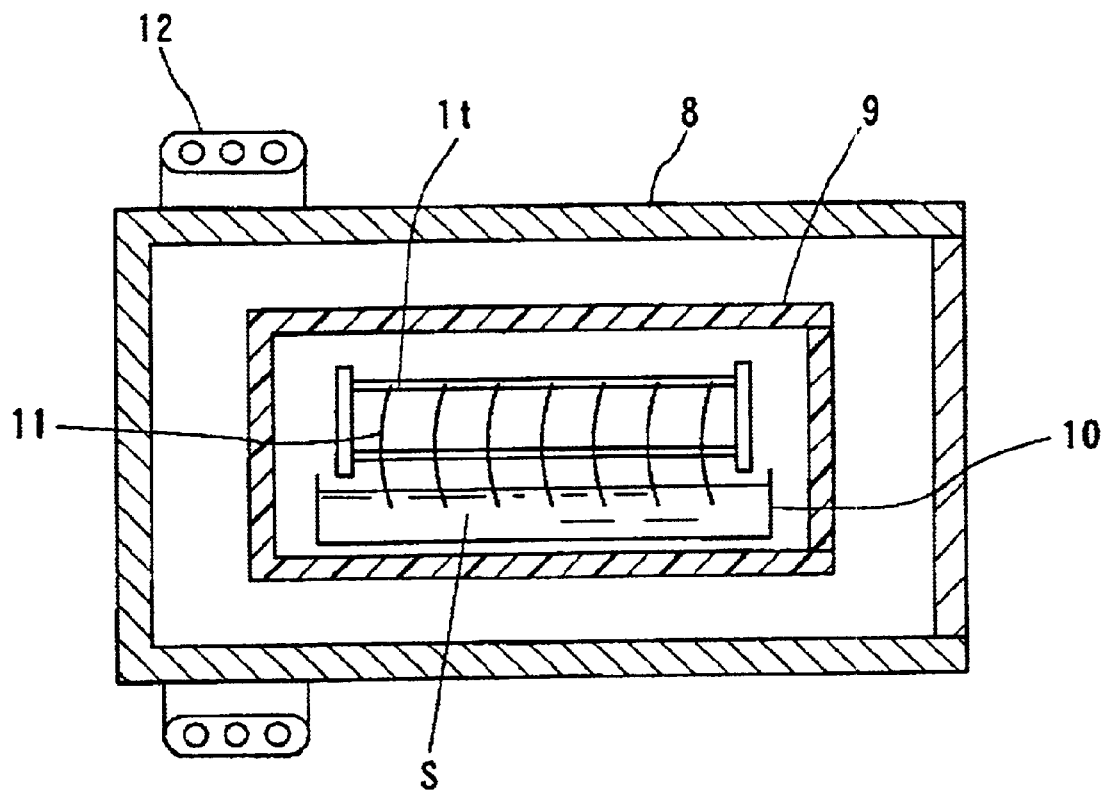
FIG. 4 is a sectional view of an induction heating furnace used for the impregnating step of the producing process of the Si—SiC wafer boat for heat treatment of semiconductor according to this invention.

The wafer boat purified body 1t assembled by adhering the purified bodies 2t, 3t, 4t is transferred to the silicon-impregnating step as shown in FIG. 4. In this silicon-impregnating step, the wafer boat calcined body 1t is housed in a porous carbon-made sealed vessel 9 with a porosity of 7–20% provided within an induction heating furnace body 8 and kept cleanly. The wafer boat purified body 1t housed in the sealed vessel 9 is placed in the separated state from a fused silicon S consisting of heated and fused polysilicon above a fused silicon tank 10 containing the fused silicon S, and a heat-resisting capillary tube body 11 having one end dipped in the fused silicon S and the other end mounted on the wafer boat compact 1t is used to impregnate the fused silicon S to the waver boat compact 1t while energizing and moving an induction heating coil 12. The impregnation of the purified body 1t is performed by use of the sealed vessel 9 provided within the induction heating furnace body 8, whereby the metal contamination of the wafer board 1 impregnated with Si can be prevented.

In the grooving step, the cutting is performed by use of a diamond blade to form the wafer-supporting support grooves 6 on the strut 3 of the wafer boat 1.

The use of the diamond blade allows the upper surface 7 of the cut support part 6 to have a surface roughness of Ra≦0.20 μm, which is not larger than that of the CVD-SiC film surface.

Since the ultra-high purity base material is used for the wafer boat 1, and the part to make contact with the semiconductor wafer W is extremely flattened into a surface roughness of 0.20 μm or less, as described above, the semiconductor wafer W is never contaminated even if no CVD-SiC film is formed on the base material surface, nor slip is caused. Since no CVD-SiC film is formed, a strict washing for removing the metal impurities segregated on the surface of the SiC film is not required.

Figure 5:
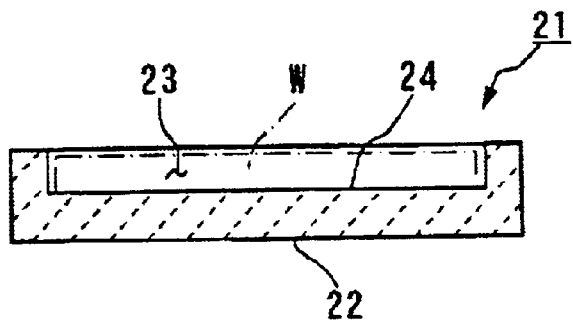
FIG. 5 is a sectional view of a single-wafer-processing susceptor, which is a modified embodiment of a Si—SiC member for heat treatment of semiconductor related to this invention.

In addition to the above description with respect to the wafer boat as the typical example, this invention will be described with respect to a single-wafer-processing susceptor as shown in FIG. 5 as a modified example.

A single-wafer-processing susceptor 21 is suitable for a wafer with a large diameter as a semiconductor wafer having a diameter of 300 mm, and it is formed of a disc-like susceptor body 22 and a housing recessed part 23 provided on the susceptor body 22 to house a semiconductor wafer W.

The base material for forming the susceptor body 21 has a Fe content of 0.05 ppm or less and a total content of Ni, Cu, Na, Ca, Cr and K of 0.1 ppm or less as the metal impurity content, and also has a surface roughness (Ra) of 0.20 μm or less in the part to make contact with the semiconductor wafer W, for example, the surface 24 of the housing recessed part 23.

The above single-wafer-processing susceptor 21 can be produced in the same method as the above-described wafer boat of the typical example.

A vertical wafer boat as a typical example of the second embodiment of the Si—SiC member for heat treatment of semiconductor according to this invention is described below in reference to the drawings.

Figure 6:
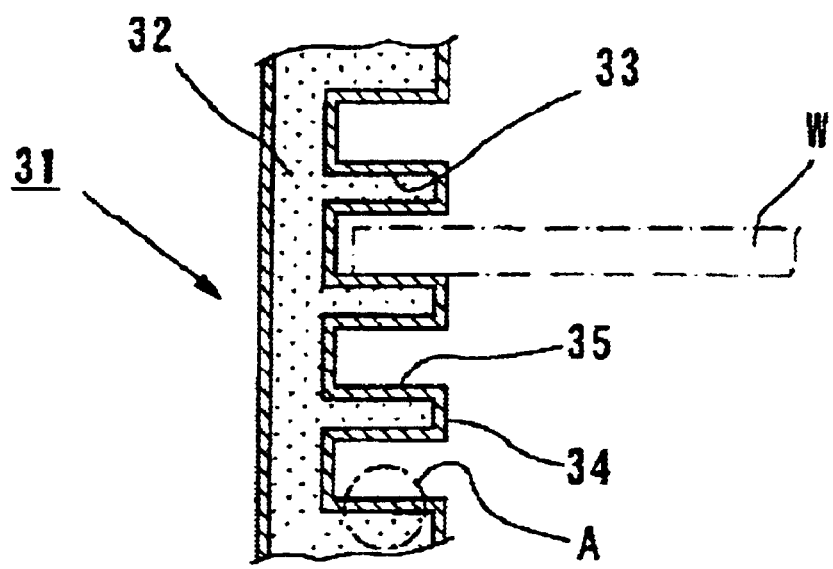
FIG. 6 is a sectional view of an essential part of a wafer boat, which is another embodiment of the Si—SiC member for heat treatment of semiconductor according to this invention.

The Si—SiC vertical wafer boat 31 of the second embodiment has the same form as the wafer boat of the first embodiment shown in FIG. 1, and it is formed of a Si—SiC base material. The wafer boat 31 is formed by assembling a bottom plate (not shown), strut 32 and top plate (not shown) formed of the Si—SiC base material as shown in FIG. 6.

Figure 7:
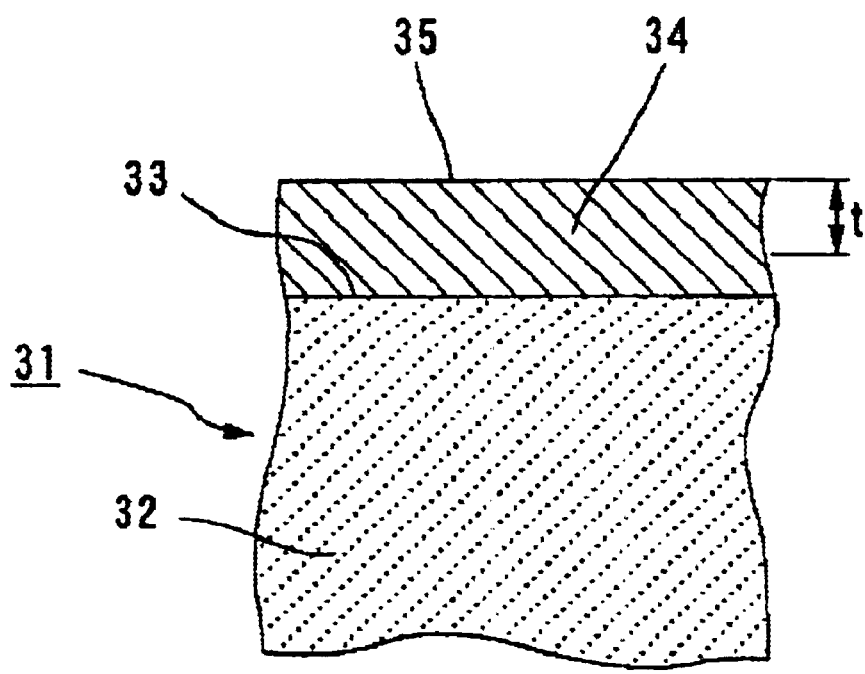
FIG. 7 is an enlarged view of the essential part A of the wafer boat shown in FIG. 6.

The Si—SiC wafer boat base material consisting of the bottom plate, strut 32 and top plate has ultra-high purity with a Fe content of 0.05 ppm or less a total content of Ni, Cu, Na, Ca, Cr and K of 0.1 ppm or less as the metal impurity content. Further, a CVD film 34 having a prescribed thickness, for example, 30–100 μm, is formed on the surface 33 of the base material for forming the bottom plate, strut 32 and top plate as shown in FIG. 7, and the content of Fe and Na is held to 300 ppb or less in the area at least a depth t of 10 μm from the surface 35 of the CVD film 34.

The reason of setting the Fe content of the base material to 0.05 ppm or less and the total content of other typical contained metals to 0.1 ppm or less is to prevent the semiconductor wafer W from being contaminated with the metal impurities segregated from the base onto the surface of the CVD-SiC film in the heat treatment of the semiconductor wafer W by use of the wafer boat 31.

When the Fe content exceeds 0.05 ppm and the total content of the typical contained metals exceeds 0.1 ppm, the metal impurities are segregated on the surface of the SiC film even if the CVD-SiC film is formed on the surface of the SiC film, and the semiconductor wafer W is metal-contaminated in the heat treatment of the semiconductor wafer W.

The reason of setting the surface roughness (Ra) of the part to make contact with the semiconductor wafer W of the wafer boat 31 to 0.20 μm or less is that the surface roughness of the CVD-SiC film is significantly influenced by the surface roughness of the base material.

When the surface roughness (Ra) exceeds 0.20 μm, the surface roughness (Ra) of the CVD-SiC film also exceeds 0.20 μm to cause a slip on the surface of the semiconductor wafer W in the heat treatment of the semiconductor wafer W.

The reason of setting the content of Fe and Na to 300 ppb or less in the area of at least a depth t of 10 μm from the surface 35 of the CVD film 34 is that the diffusion of the metal impurities to the part to make contact with the semiconductor wafer W can be minimized, so that the contamination of the semiconductor wafer W can be prevented in the heat treatment of the semiconductor wafer W.

When the content of Fe and Na exceeds 300 ppb, the semiconductor wafer W is contaminated with the Fe and Na contained in the CVD film 34 in the heat treatment of the semiconductor wafer W.

The Si—SiC wafer boat 31 of the second embodiment can be produced also according to the process flow shown in FIG. 3 similarly to the production of the Si—SiC wafer boat 1 of the first embodiment.

On the wafer boat 31 produced and grooved in the same manner as the wafer boat of the first embodiment, the CVD film 34 having a thickness, for example, 30 μm–100 μm is formed according to an ordinary CVD method The wafer boat 31 having the CVD film 34 formed thereon is washed and completed.

Since the ultra-high purity base material is used for the wafer boat 31, the part to make contact with the semiconductor wafer W is extremely flattened, and the CVD-SiC film is formed on the base material surface, as described above, the contamination of the semiconductor wafer W can be further prevented, and the occurrence of the slip can be also suppressed. In spite of the formation of the CVD-SiC film, the segregation of metal impurities onto the surface of the SiC film can be eliminated by use of the ultra-high purity base material, and the strict washing can be dispensed with.

As a modified example of the second embodiment, a single-wafer-processing susceptor having the CVD film formed thereon is considerable.

EXAMPLES 1–6

Examples 1–6 and a plurality of comparative examples are described below.

[1] Evaluation Test of Wafer Boat Base Material

The metal impurity content of the wafer boat base material is measured.

(1) Production of Sample

Example 1: An acrylic binder, which is a molding assistant, was added to an ultra-high purity SiC powder (total metal impurity quantity of 0.2 ppm or less) having the average particle size and metal impurity content shown in Table 1 followed by kneading to produce a test piece compact having a section of 2 cm×2 cm and a length of 30 cm by casting. The compact was baked (calcined) at 1700° C. for about 2 hours in argon atmosphere, and then purified at 1900° C. in halogen gas-containing atmosphere to provide a test piece. The test piece purified body was placed in a high purity carbon sealed vessel with a porosity of 13% provided within an induction heating furnace body to provide a test piece impregnated body impregnated with fused silicon.

Comparative Example 1: A test piece impregnated body was produced in the same manner as the above example except using a SiC powder having the average particle size and metal impurity content shown in Table 1 (total metal impurity quantity exceeding 0.2 ppm) and adapting a conventional impregnating method using no sealed vessel in the impregnating step.

(2) Measuring Method

The test pieces of Example 1 and Comparative Example 1 obtained in the above (1) were partially cut, and the solutions thereof extracted with acid were subjected to a measurement by ICP emission spectral analysis.

(3) Measurement Result

The measurement result is shown in Table 2.

In Example 1, even the Fe content, which is the highest therein, is as small as 0.02 ppm, and the contents of all other metals are 0.01 ppm or less, which shows that the test piece of Example 1 has extremely ultra-high purity. On the other hand, the Fe content in Comparative Example 1 is 0.27 ppm, which is 13.5 times Example 1, and the contents of the other metals are also 3–6 times the Example.

[2] Measurement of Surface Roughness in Support Groove of Wafer Boat

The surface roughness of the support groove to make contact with a semiconductor wafer is measured.

(1) Production of Test Piece

To Example 2: An acrylic binder, which is a molding assistant, was added to an ultra-high purity SiC powder (total metal impurity quantity of 0.2 ppm or less) having the average particle size and metal impurity content as shown in Table 1 followed by kneading to produce a bottom plate compact, a strut compact and a top plate compact by casting. The resulting compacts were adhered by use of an adhesive (obtained by adding a phenolic binder to a mixed powder consisting of silicon carbide powder and carbon powder) to assemble a boat compact. The boat compact was baked (calcined) at 1700° C. for about 2 hours in argon atmosphere, and then purified at 1950° C. in halogen gas-containing atmosphere to provide a boat purified body. The boat purified body was placed in a high purity carbon-made sealed vessel with a porosity of 15% provided within an induction heating furnace body to provide a wafer boat impregnated body impregnated with fused silicon under reduced pressure. The induction heating furnace body was provided with a mechanism for introducing $N_2$ gas, which is an inert gas, from one furnace wall and discharging the $N_2$ gas from the other furnace wall by a vacuum pump. A support groove was formed on the wafer boat impregnated body by use of a diamond blade to provide a wafer boat for 8-inch wafer.

Comparative Examples 2–3: By use of a high purity SiC powder having the average particle size and metal impurity content as shown in Table 2 (total metal impurity quantity exceeding 0.2 ppm), a wafer boat for 8inch wafer was provided in the same manner as Example 2 [Comparative Example 2 (base material)]. In the silicon-impregnating step, a conventional method of impregnating silicon on a heater induction-heated by a movable high frequency coil was adapted. Further, a SiC film was formed on the wafer boat by CVD [Comparative Example 3 (with film)]. The purifying treatment was performed according to a conventional method, and the support groove was formed by use of a conventional cutting tool.

(2) Measuring Method

The support piece having the support groove formed thereon was cut from each of Example 2 and Comparative Example 3 (with film) obtained in the above (1), and the surface roughness was measured for the surface for supporting a semiconductor wafer by use of a surface roughness measuring machine.

(3) Measurement Result

The measurement result is shown in Table 3.

The surface roughness of Example 2 is as extremely flat as 0.12 μm, compared with 0.46 μm of Comparative Example 3 (with film).

[3] Impurity Transfer Test of Wafer Boat

The metal impurity quantity transferred to a semiconductor wafer during heat treatment is measured by use of a wafer boat.

(1) Production of Sample

The wafer boats produced in the above [2](1) [Example 2, Comparative Example 2 (Base material), Comparative Example 3 (with film)] were prepared.

(2) Measuring Method

One 8-inch silicon wafer was loaded on each of the wafer boats [Example 2, Comparative Example 2 (base material), Comparative Example 3 (with film)], and heated at 1100° C. in $N_2/O_2$ atmosphere to measure the metal impurities transferred onto the silicon wafer surface.

(3) Measurement Result

The measurement result is shown in Table 4.

The transferred quantity in Example 2 is smaller than in Comparative Example 3 (with film) for the metals other than Ni and Ca. Compared with Comparative Example 2 (base material) having no CVD film, the transfer quantity is as small as about ⅕–½ for all the metals.

[4] Test for Occurrence of Slip of Semiconductor Wafer by Wafer Boat (1) Measuring Method In three positions of the upper, center and lower parts of Example 2 and Comparative Example 3 (with film) obtained in the above [2](1), three in total of 8-inch silicon wafers were loaded one by one, the temperature was raised at a prescribed speed to 1200° C., this temperature was held for 1 hour, and the silicon wafers were thereafter taken out to observe the state of occurrence of slip by use of a differential interference microscope.

(2) Observation Result

The observation result is shown in Table 5.

While a lot of slips occur in the silicon wafers loaded in the center and lower parts in Comparative Example 3 (with film), while no slip occurs in the silicon wafer loaded in any position in Example 2.

[5] Measurement of Metal Contamination of Si-Impregnated Base Material Depending on Difference in Impregnating Method (1) Production of Sample Two boat compacts were produced in the same manner as the above [2](1), one was impregnated with Si according to a conventional Si impregnating method not using a sealed vessel as in this invention (Comparative Example 4), and the other was impregnated with Si according to the Si impregnating method according to this invention [the same as the above [2](1)] (Example 3).

Example 4: The production was performed in the same manner as Example 3 except performing the Si impregnation within a high purity glass carbon vessel with a porosity of 0.5%.

Example 5: The production was performed in the same manner as Example 3 except performing the Si impregnation within a high purity carbon vessel with a porosity of 30%.

Test pieces were cut from the Si-impregnated boat impregnation bodies impregnated with Si according to the respective methods.

(2) Measuring Method

Each sample was measured by ICP emission spectral analysis.

(3) Measurement Result

The measurement result is shown in Table 6.

The metal impurity contents of the base materials impregnated with Si by use of Examples 3-5 are remarkably lower than the metal impurity content of the base material impregnated by use of Comparative Example 4.

It was confirmed that the Fe content was slightly higher in both Example 4 using the high purity glass carbon vessel with porosity of 0.5% as the sealed vessel and Example 5 using the high purity carbon vessel with porosity of 30% than in Example 3 using the high purity carbon vessel with porosity of 15%.

[6] Evaluation Test of Wafer Boat Base Material

The metal impurity content of a wafer boat base material having a CVD film formed thereon is measured.

(1) Production of Sample

Example 6: A wafer boat for heat treatment of 8-inch wafer having the metal impurity content shown in Table 7 was produced in the same manner as Example 2 of the above

[2](1). This base material was placed in an atmosphere mainly composed of silane gas at 1100° C. to form a SiC film by CVD method (Example 6). In the production of this wafer boat, a small sample of the same ultra-high purity base material as the wafer boat was also placed therein to form the CVD film.

Comparative Example 5: A wafer boat for heat treatment of 8-inch M wafer having the metal impurity content shown in Table 7 was produced in the same manner as Comparative Example 4 described above. A CVD-SiC film was formed on this base material in the same manner as Example 6 (Comparative Example 5). In the production of this wafer boat, a small sample of the same ultra-high purity base material as the wafer boat was placed to form the CVD film.

(2) Measuring Method

By use of Example 6 and Comparative Example 5 obtained in the above (1), a wafer evaluation (semiconductor evaluation) as described below was performed.

1) After the wafer boats of Example 6 and Comparative Example 5 were subjected to a first wet washing (easy washing for eliminating handling contamination) with HF+$H_2O$ (1:10), wafers were loaded thereon and heated at 1100° C. in $N_2/O_2$ atmosphere, and the impurity quantities transferred to the wafer surface were measured.

2) After the first washing, a second wet washing of performing an acid treatment at 1100° C. in $O_2$ and removing the resulting oxide film having the surface impurities trapped thereon with HF+$H_2O$, and the heat treatment and wafer evaluation were then performed.

3) In the production of the wafer boats of Example 6 and Comparative Example 5, the measurement of the internal impurities of the CVD film was performed by use of each sample produced simultaneously thereto.

(3) Measurement Result

1) The measurement result of the first washing is shown in Table 8.

It was found that the metal impurity quantity transferred to the wafer surface could be minimized for each element in Example 6 even by the simple washing, and the transfer quantity was remarkably small, compared with Comparative Example 5. Especially, the difference in transfer quantity of Fe and Na is large between the both.

2) The measurement result of the second washing is shown in Table 9.

It was found that the metal impurity quantity transferred to the wafer surface can be extremely minimized for each element in Example 6 by the twice washing, and the transfer quantity was remarkably small, compared with Comparative Example 5. Especially, the difference in transfer quantity of Fe and Na is large between the both.

Figure 8:
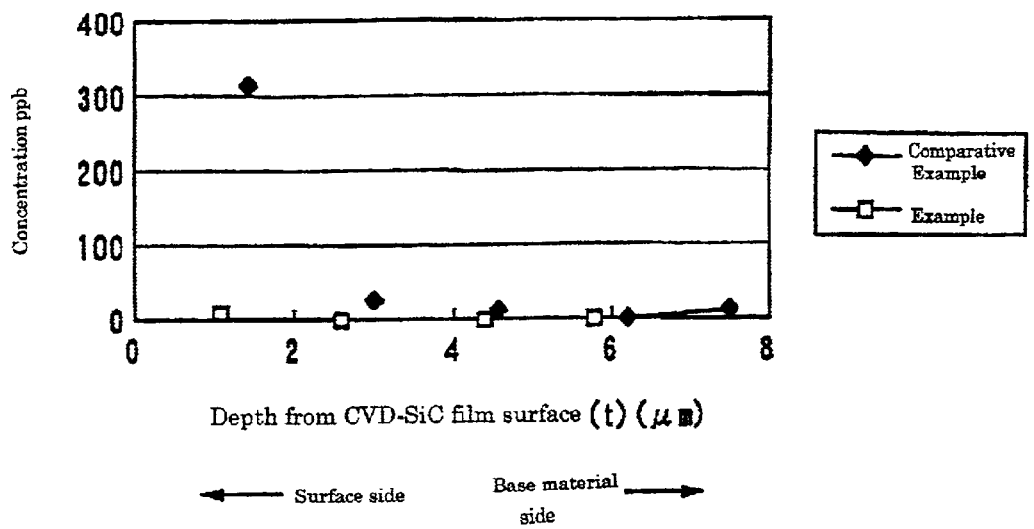
FIG. 8 is a view illustrating the film internal concentration distribution of Fe in an example of this invention.
Figure 9:
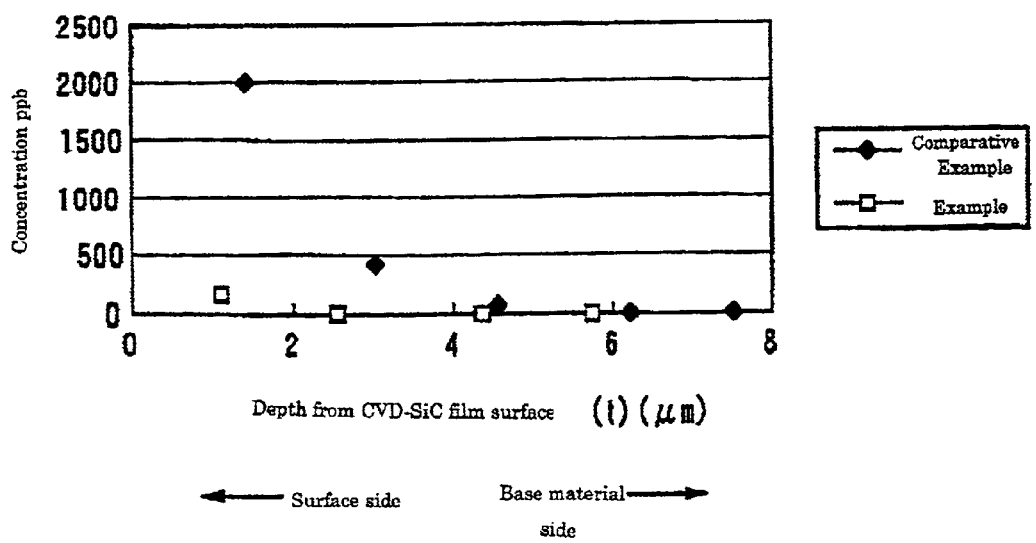
FIG. 9 is a view illustrating the film internal concentration distribution of Na in the example of this invention.
Figure 10:
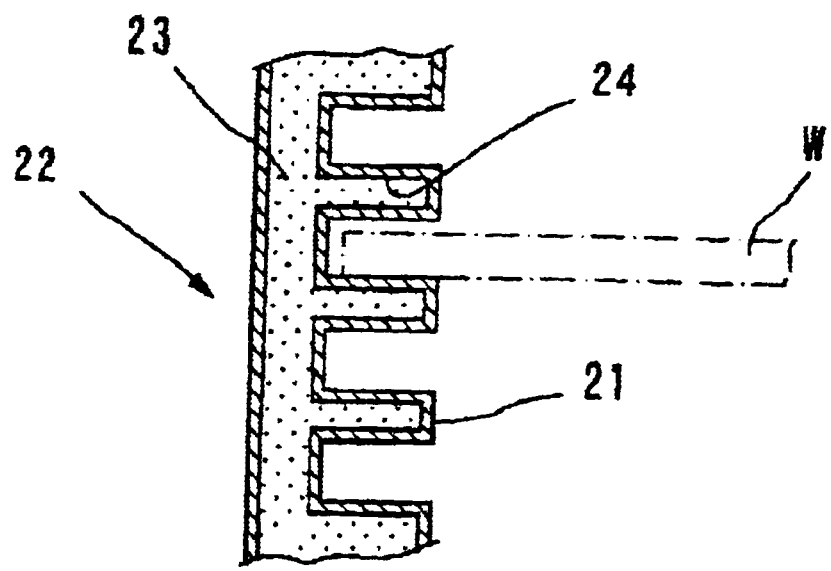
FIG. 10 is a sectional view of an essential part of a conventional wafer boat.

3) The measurement result for the internal impurities of the CVD film is shown in FIG. 8 and FIG. 9.

With respect to Fe and Na in which a particular difference was observed between both the samples of the measured elements, the film internal concentration distributions are shown in FIG. 8 and FIG. 9.

It was found that the film internal distribution concentration was remarkably low in the film thickness range of 1–5 μm for both Fe and Na, compared with the Comparative Example.

Figure 11:
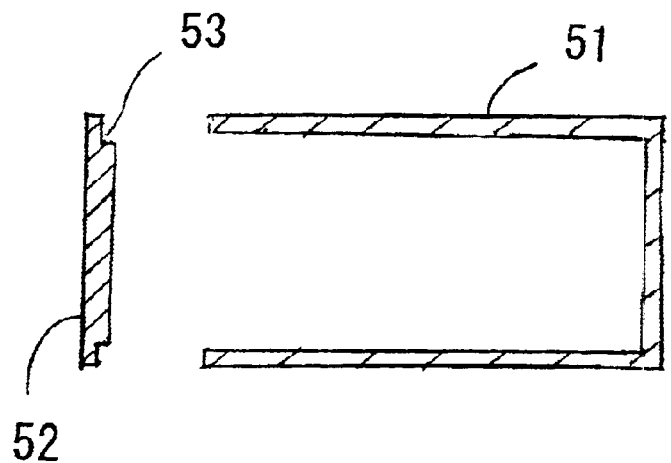
FIG. 11 is a sectional view showing one example of a sealed vessel used for the method of this invention.

FIG. 11 shows one example of the sealed vessel. The sealed vessel 51 has no hole extending through the thickness direction of the base material constituting it. The side part of the sealed vessel 51 is opened, and it is closable by a lid 52. Denoted at 53 is the fitting part of the lid 52. The purified body of the SiC member is taken out and in through this part.

Figure 12:
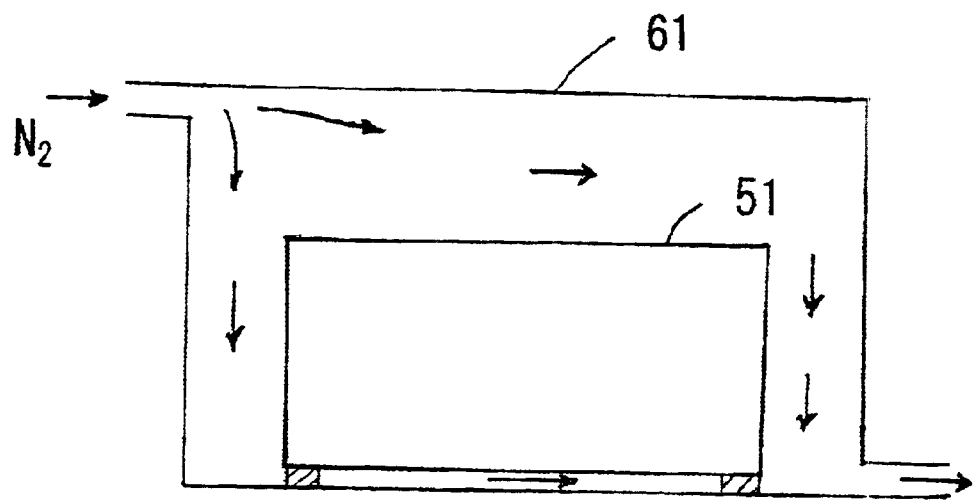
FIG. 12 is a sectional view showing one example of a heating furnace used for the method of this invention.

FIG. 12 shows one example of the internal structure of the heating furnace. The sealed vessel 51 is arranged within a furnace body 61, so that the inert gas can be sufficiently carried as shown by the arrow. Consequently, the vapor leaving through the pore part of the sealed vessel 61 is efficiently discharged.

The effect of this invention is further described.

The method for producing a Si—SiC member for heat treatment of semiconductor according to this invention allows to provide a Si—SiC member reduced in the metal contamination to a semiconductor (wafer) to be heated as much as possible.

Particularly, the working step of setting the surface roughness (Ra) of the part to make contact with the semiconductor in the Si—SiC member for heat treatment of semiconductor to 0.20 μm or less is added, whereby the occurrence of slip in the heat treatment of a semiconductor wafer with a large diameter of 8 inches or more at high temperature can be reduced as much as possible.

TABLE 1

Average Particle Size and Metal Impurity Content of Raw Material Powder (ppm)

| | Powder | Average Particle Size (μm) | Fe | Ni | Cr | Cu | Ca | Na | K |
|---|---|---|---|---|---|---|---|---|---|
| Ex. 1 | Ultra-High Purity | 40 | 0.05 | <0.01 | <0.01 | 0.01 | 0.02 | 0.01 | 0.01 |
| | SiC (*1) | 10 | 0.04 | 0.02 | <0.01 | <0.01 | 0.03 | <0.01 | <0.01 |
| C. Ex. 1 | High Purity | 40 | 0.68 | 0.26 | <0.01 | <0.01 | 0.04 | 0.03 | 0.02 |
| | SiC (*2) | 10 | 0.12 | 0.05 | <0.01 | <0.01 | 0.05 | 0.01 | <0.01 |

(*1) (*2) A rough grain assembly with average particle size of 40 μm and a fine grain assembly with average particle size of 10 μm were mixed in a weight ratio of 70:30.

TABLE 2

Metal Impurity Content of Wafer Boat (ppm)

| | Fe | Ni | Cr | Cu | Ca | Na | K |
|---|---|---|---|---|---|---|---|
| Ex. 1 | 0.02 | 0.01 | <0.01 | <0.01 | <0.01 | 0.01 | 0.01 |
| C. Ex. 1 | 0.27 | 0.03 | 0.04 | 0.05 | 0.06 | 0.02 | 0.03 |

TABLE 3

Surface Roughness of Contact Surface with Semiconductor Wafer, Ra ($\mu$m)

| | Surface Roughness |
|---|---|
| Ex. 2 | 0.12 |
| C. Ex. 3 (with film) | 0.45 |

TABLE 4

Metal Impurity Quantity Transferred to Silicon Wafer (×E10 atoms/cm$^2$)

| | Fe | Ni | Cr | Cu | Ca | Na | K |
|---|---|---|---|---|---|---|---|
| Ex. 2 | 4.0 | 0.8 | 0.4 | 0.8 | 1.4 | 2.5 | 1.2 |
| C. Ex. 2 (base material) | 22.0 | 1.5 | 0.9 | 2.0 | 2.5 | 4.5 | 2.5 |
| C. Ex. 3 (with film) | 5.0 | 0.7 | 0.5 | 1.2 | 1.4 | 2.7 | 1.5 |

TABLE 5

State of Occurrence of Slip in Silicon Wafer

| | Loading Position of Wafer | | | |
|---|---|---|---|---|
| | Upper Part | Center Part | Lower Part | Remark |
| Example | Non | Non | Non | |
| C.Ex.3 (with film) | Non | Five points | Eight points | Occurred from the contact part with the support part in both cases |

TABLE 6

Metal Impurity Content of Base Material Depending on Difference in Impregnating Method (ppm)

| | Fe | Ni | Cr | Cu | Ca | Na | K | Al | V |
|---|---|---|---|---|---|---|---|---|---|
| Ex. 3 | 0.02 | <0.01 | <0.01 | <0.01 | <0.01 | <0.01 | <0.01 | <0.01 | 0.02 |
| C. Ex. 4 | 0.56 | 0.02 | 0.05 | <0.01 | 0.03 | 0.01 | 0.01 | 0.44 | 0.16 |
| Ex. 4 | 0.07 | 0.03 | <0.01 | <0.01 | <0.01 | <0.01 | <0.01 | <0.01 | 0.02 |
| Ex. 5 | 0.30 | 0.01 | 0.02 | <0.01 | <0.01 | <0.01 | <0.01 | <0.01 | <0.01 |

TABLE 7

Metal Impurity Content of Wafer Boat Base Material (ppm)

| | Fe | Ni | Cr | Cu | Ca | Na | K |
|---|---|---|---|---|---|---|---|
| Ex. 2 | <0.01 | 0.01 | <0.01 | <0.01 | <0.01 | 0.01 | 0.01 |
| C. Ex. 4 | 6.30 | 0.60 | 0.30 | 0.10 | 0.60 | 0.92 | 0.43 |

TABLE 8

Metal Impurity Quantity Transferred to Water Surface (After First Wet Washing) (×E10 atoms/cm$^2$)

| | Fe | Ni | Cr | Cu | Ca | Na | K |
|---|---|---|---|---|---|---|---|
| Ex. 6 | 8.0 | 1.6 | 0.9 | 2.8 | 2.2 | 4.0 | 2.2 |
| C. Ex. 5 | 25.0 | 2.5 | 1.9 | 3.0 | 4.5 | 18.0 | 3.2 |

TABLE 9

Metal Impurity Quantity Transferred to Water Surface (After Second Wet Washing) (×E10 atoms/cm$^2$)

| | Fe | Ni | Cr | Cu | Ca | Na | K |
|---|---|---|---|---|---|---|---|
| Ex. 6 | 4.0 | 0.8 | 0.4 | 0.8 | 1.4 | 2.5 | 1.2 |
| C. Ex. 5 | 11.0 | 1.2 | 0.9 | 3.0 | 2.5 | 9.5 | 2.0 |

What is claimed is:

1. A method for producing a Si—SiC member for heat treatment of semiconductor comprising the first step kneading a SiC powder having a total metal impurity quantity of 0.2 ppm or less with a molding assistant; the second step of forming a compact from the kneaded raw material; the third step of calcining the compact; the fourth step of purifying the calcined body; and the fifth step of impregnating the purified body with silicon within a sealed vessel provided in a heating furnace body.

2. A method for producing a Si—SiC member for heat treatment of semiconductor according to claim 1 which further comprises the sixth step of machining at least the part to make contact with a semiconductor to be heated into a surface roughness of 0.2 $\mu$m or less in addition to the above first to fifth steps.

3. A method for producing a Si—SiC member for heat treatment of semiconductor according to claim 1 wherein the sealed vessel is formed of a porous carbon material with a porosity of 7–20%.

4. A method for producing a Si—SiC member for heat treatment of semiconductor according to claim 2 wherein the sealed vessel is formed of a porous carbon material with a porosity of 7–20%.

5. A method for producing a Si—SiC member for heat treatment of semiconductor according to claim 4 wherein a mechanism for introducing and discharging an inert gas in provided on the heating furnace body.

6. A method for producing a Si—SiC member for heat treatment of semiconductor according to claim 5 wherein the purifying step is performed by a heat treatment at a temperature of 1900–2000° C. in halogen gas-containing atmosphere.

7. A method for producing a Si—SiC member for heat treatment of semiconductor according to claim 6 wherein the machining step is performed by use of a diamond blade.

8. A method for producing a Si—SiC member for heat treatment of semiconductor according to claim 7 wherein a CVD-SiC film forming step is performed after the machining step.

9. A method for producing a Si—SiC member for heat treatment of semiconductor according to claim 8 wherein a wet acid washing is performed after the CVD-SiC film forming step.

10. A method for producing a Si—SiC member for heat treatment of semiconductor according to claim 9 wherein a heat treatment is performed in high-temperature acidic atmosphere after the wet acid washing step to form a silicon oxide film on the surface, and the silicon oxide film is then removed by wet washing.

* * * * *